(12) United States Patent
Wang et al.

(10) Patent No.: US 12,278,195 B1
(45) Date of Patent: Apr. 15, 2025

(54) SHIELDING OF PACKAGED MAGNETIC RANDOM ACCESS MEMORY

(71) Applicant: Avalanche Technology, Inc., Fremont, CA (US)

(72) Inventors: Zihui Wang, Mountain View, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 18/542,672

(22) Filed: Dec. 16, 2023

(51) Int. Cl.
| | |
|---|---|
| H01L 23/552 | (2006.01) |
| H01L 23/00 | (2006.01) |
| H01L 23/498 | (2006.01) |
| H01L 25/065 | (2023.01) |
| H10B 80/00 | (2023.01) |

(52) U.S. Cl.
CPC ...... *H01L 23/552* (2013.01); *H01L 23/49822* (2013.01); *H01L 24/16* (2013.01); *H01L 24/32* (2013.01); *H01L 24/48* (2013.01); *H01L 24/73* (2013.01); *H01L 25/0657* (2013.01); *H10B 80/00* (2023.02); *H01L 24/17* (2013.01); *H01L 24/33* (2013.01); *H01L 2224/16146* (2013.01); *H01L 2224/16227* (2013.01); *H01L 2224/17181* (2013.01); *H01L 2224/32145* (2013.01); *H01L 2224/32225* (2013.01); *H01L 2224/33181* (2013.01); *H01L 2224/48091* (2013.01); *H01L 2224/48227* (2013.01);
(Continued)

(58) Field of Classification Search
CPC ............. H01L 23/552; H01L 23/49822; H01L 25/0657; H01L 24/16; H01L 24/32; H01L 24/48; H01L 24/73; H10B 61/00; H10B 80/00; H10N 50/80

USPC .................................. 257/659, 257, E21.502
See application file for complete search history.

(56) References Cited

U.S. PATENT DOCUMENTS

| | | |
|---|---|---|
| 4,953,002 A | 8/1990 | Nelson et al. |
| 5,561,265 A | 10/1996 | Livshits et al. |

(Continued)

OTHER PUBLICATIONS

Bhushan et al., "Enhancing Magnetic Immunity of STT-MRAM with Magnetic Shielding," 2018 IEEE International Memory Workshop (IMW), Kyoto, Japan, 2018, pp. 1-4, doi: 10.1109/IMW.2018.8388828.

*Primary Examiner* — Jasmine J Clark
(74) *Attorney, Agent, or Firm* — Bing K. Yen

(57) ABSTRACT

A packaged semiconductor device includes one or more semiconductor dies with at least one MRAM die; a package substrate having first and second planar surfaces that are substantially larger than planar surfaces of the semiconductor dies, the first planar surface of the package substrate being disposed adjacent to the semiconductor dies and including a plurality of package bond pads that are electrically connected to the semiconductor dies, the second planar surface of the package substrate including a plurality of solder bumps electrically connected to the package bond pads; and a soft magnetic cap confronting the semiconductor dies and having an edge that extends toward and attaches to the package substrate, thereby encapsulating the semiconductor dies. The package substrate includes first and second outer conductive layers and a soft magnetic layer interposed between and separated from the first and second outer conductive layers by first and second insulating layers.

20 Claims, 12 Drawing Sheets

(52) U.S. Cl.
CPC .............. *H01L 2224/73215* (2013.01); *H01L 2224/73265* (2013.01); *H01L 2924/1443* (2013.01)

(56) References Cited

U.S. PATENT DOCUMENTS

| | | |
|---|---|---|
| 5,902,690 A | 5/1999 | Tracy et al. |
| 5,939,772 A | 8/1999 | Hurst et al. |
| 6,627,932 B1 | 9/2003 | Drewes |
| 6,906,396 B2 | 6/2005 | Tuttle et al. |
| 6,936,763 B2 | 8/2005 | Rizzo et al. |
| 7,183,617 B2 | 2/2007 | Wang et al. |
| 7,459,769 B2 | 12/2008 | Kato et al. |
| 7,545,662 B2 | 6/2009 | Wang et al. |
| 7,598,596 B2 | 10/2009 | Molla et al. |
| 7,687,283 B2 | 3/2010 | Terui |
| 7,772,679 B2 | 8/2010 | Chang et al. |
| 8,125,057 B2 | 2/2012 | Bonin et al. |
| 9,070,692 B2 | 6/2015 | Zhou et al. |
| 9,786,838 B2 | 10/2017 | Ugge |
| 9,954,163 B2 | 4/2018 | Lin et al. |
| 10,157,857 B2 | 12/2018 | Huang et al. |
| 10,643,954 B2 | 5/2020 | Ugge |
| 10,998,489 B2 * | 5/2021 | Widdershoven ...... H01L 23/552 |
| 11,088,317 B2 | 8/2021 | Lin et al. |
| 2009/0184403 A1 * | 7/2009 | Wang ..................... H01L 23/552 |
| | | 257/659 |
| 2012/0193737 A1 * | 8/2012 | Pang ..................... H01L 21/561 |
| | | 257/659 |
| 2012/0211846 A1 * | 8/2012 | Li ......................... H01L 23/552 |
| | | 257/659 |
| 2017/0025471 A1 * | 1/2017 | Bhushan ................ H10N 50/80 |

\* cited by examiner

SHIELDING OF PACKAGED MAGNETIC RANDOM ACCESS MEMORY

BACKGROUND OF THE INVENTION

The present invention relates to magnetic memory, and more particularly, to embodiments of a chip package that shield magnetic random access memory (MRAM) dies from external stray magnetic fields.

A spin transfer torque (STT) MRAM device normally comprises an array of magnetic memory cells, each of which includes a magnetic memory element and a selection element, such as access transistor, coupled in series between two electrodes. The selection element functions like a switch to direct current or voltage through the selected magnetic memory element coupled thereto. Upon application of an appropriate voltage or current to the selected magnetic memory element, the resistance of the magnetic memory element would change accordingly, thereby switching the stored logic in the respective magnetic memory cell.

FIG. 1 is a schematic circuit diagram for a conventional magnetic memory array 20, which comprises a plurality of magnetic memory cells 22 arranged in rows and columns with each of the magnetic memory cells 22 including an access transistor 24 coupled to a magnetic memory element 26; a plurality of parallel word lines 28 with each being coupled to the gates of a respective row of the access transistors 24 in a first direction; a plurality of parallel bit lines 30 with each being coupled to a respective column of the magnetic memory elements 26 in a second direction substantially perpendicular to the first direction; and a plurality of parallel source lines 32 with each being coupled to a respective column of the access transistors 24 in the second direction.

The magnetic memory element 26 normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current to the MTJ, the magnetization direction of the magnetic free layer can be switched between two configurations: parallel (i.e., same direction) and antiparallel (i.e., opposite direction) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially antiparallel or oriented in opposite directions. The stored logic in the magnetic memory element can be switched by changing the magnetization direction of the magnetic free layer between parallel and antiparallel configurations with respect to the magnetization direction of the reference layer. Therefore, the two stable resistance states enable the MTJ to serve as a nonvolatile memory element.

Expectedly, owing to the magnetic free layer being a layer made of magnetic material, it can also be switched or perturbed by an externally applied magnetic field, when the field strength is sufficiently strong (e.g., 100 Gauss or higher). FIG. 2 depicts an MRAM die 40 being subjected to applied magnetic field 42. When the MRAM die 40 is exposed to the external magnetic field 42, the magnetic field 42 may perturb or even erase the stored information by rotating or switching the magnetization of the data storage layer, i.e. magnetic free layer, of the MTJ in the memory element, thereby corrupting the data. To reduce the undesired effect of the magnetic field 42 on the memory die 40, magnetic shielding may be used to reduce the effective field that is acting on the MRAM die 40.

Therefore, magnetic shielding is generally required for STT-MRAM device to function properly as a data storage device without being perturbed or erased by unwanted external fields from the environment. Typically, one or more magnetic shields 44 shaped into blocks or sheets are disposed close to the MRAM die 40 in the chip-packaging process, as shown in FIG. 3. The magnetic shields 44, which are made of a soft magnetic material, is easily magnetized by the applied magnetic field 42 and the shield magnetization is aligned in the same direction as the applied magnetic field 42.

FIG. 3 further illustrates the net magnetic field 46, which is formed from combining the applied magnetic field 42 and the field generated by the shield magnetization (not shown), appears to be diverted from the MRAM die 40. This is because the magnetic flux, whose spatial density reflects the magnetic field strength, is concentrated and conducted by the shield material and the space close to the shield material is effectively depleted of the magnetic field. Positioning the MRAM die 40 close to the magnetic shields 44 can reduce the effective magnetic field that the MRAM die 40 is exposed to under a given applied magnetic field.

However, the conventional approach of using two soft magnetic plates or blocks 44 disposed on two opposite planar surfaces of the MRAM die 40 as shields becomes ineffective when a magnetic field 48 or a component thereof is substantially perpendicular to the planar surfaces of the MRAM die 40, as shown in FIG. 4, because the magnetic shields 44 do not effectively divert the magnetic field 48 away from the MRAM die 40. This is a particularly acute issue for the new STT-MRAM devices, whose magnetic free layer has magnetization directions that are substantially perpendicular to the planar surfaces of the MRAMS die 40 and thus is sensitive to perpendicular magnetic field.

FIG. 5 illustrates the use of a full wrap-around magnetic shield 50 to shield the MRAM die 40 from the external magnetic field 48, even when the field or a component thereof is perpendicular to the planar surfaces of the MRAM die 40. However, in practice it is difficult to implement the wrap-around shielding for MRAM dies because the shielding needs to provide openings for the interconnection between the dies and corresponding packages (i.e., wire bonding). Therefore, the cost and complexity associated with manufacturing of the full wrap-around shield 50 to encase the MRAM die 40 are high and may prove impractical for commercial products.

For example, FIG. 6 illustrates an implementation of the wrap-around shielding concept for MRAM. The prior art MRA device 60 is fabricated by first bonding the MRAM die 40 to the bottom shield 62 with a layer of epoxy 64. The die/bottom shield assembly is then bonded to the package substrate 66 with another layer of epoxy 68. The top magnetic shield 70 is then bonded to the MRAM die 40 with a magnetic epoxy 72. Unlike the conventional packaging process, the subsequent wire bonding process is carried out through a small slit in the bottom shield 62 and solder bumps 74 are formed on the same substrate surface as the wire bond. The packaging process for the MRAM device 60 is complicated and may be incompatible with the conventional packaging process and equipment.

Other information relevant to attempts to address problems associated with the magnetic shielding of MRAM dies can be found in U.S. Pat. Nos. 4,953,002, 5,561,265, 5,902,690, 5,939,772, 6,627,932, 6,906,396, 6,936,763, 7,183,617, 7,459,769, 7,545,662, 7,598,596, 7,687,283, 7,772,679, and 8,125,057. However, each one of these references suffers from one or more of the following disadvantages: degraded shielding effect owing to the large distance between the MRAM die and magnetic shields; insufficient shielding material; complex packaging structure that is difficult and costly to manufacture; incompatible with multiple die packaging; incompatible with flip-chip packaging.

For the foregoing reasons, there is a need for a packaged MRAM device that can effectively shield the MRAM die therein from external magnetic fields and that can be reliably manufactured using the conventional packaging process to reduce cost.

SUMMARY OF THE INVENTION

The present invention is directed to a device that satisfies this need. A packaged semiconductor device having features of the present invention includes a magnetic random access memory (MRAM) die having first and second planar surfaces with the first planar surface of the MRAM die including a plurality of die bond pads formed thereon; a package substrate having first and second planar surfaces that are substantially larger than the first and second planar surfaces of the MRAM die and extending beyond the MRAM die on opposing sides, the first planar surface of the package substrate being disposed adjacent to the second planar surface of the MRAM die and including a plurality of package bond pads formed on a portion of the first planar surface of the package substrate not covered by the MRAM die, the second planar surface of the package substrate including a plurality of solder bumps that are electrically connected to the package bond pads; a plurality of bonding wires electrically connecting the die bond pads to the package bond pads; and a soft magnetic cap confronting the first planar surface of the MRAM die and having an edge that extends toward and attaches to the package substrate, thereby encapsulating the MRAM die. The package substrate has a laminated structure that includes first and second outer conductive layers; a soft magnetic layer disposed between the first and second outer conductive layers; a first insulating layer disposed between the soft magnetic layer and the first outer conductive layer; and a second insulating layer disposed between the soft magnetic layer and the second outer conductive layer.

According to another aspect of the present invention, a packaged semiconductor device includes a stack of semiconductor dies including at least one magnetic random access memory (MRAM) die, each semiconductor die having first and second planar surfaces with the first planar surface including a plurality of die bond pads formed thereon; a package substrate having first and second planar surfaces that are substantially larger than the first and second planar surfaces of the stack of semiconductor dies and extending beyond the stack of semiconductor dies on opposing sides, the first planar surface of the package substrate being disposed adjacent to a bottom semiconductor die of the stack of semiconductor dies and including a plurality of package bond pads formed on a portion of the first planar surface of the package substrate not covered by the stack of semiconductor dies, the second planar surface of the package substrate including a plurality of solder bumps that are electrically connected to the package bond pads; a plurality of bonding wires electrically connecting the die bond pads of each die of the stack of semiconductor dies to the package bond pads; and a soft magnetic cap confronting a top semiconductor die of the stack of semiconductor dies and having an edge that extends toward and attaches to the package substrate, thereby encapsulating the stack of semiconductor dies. The package substrate has a laminated structure that includes first and second outer conductive layers; a soft magnetic layer disposed between the first and second outer conductive layers; a first insulating layer disposed between the soft magnetic layer and the first outer conductive layer; and a second insulating layer disposed between the soft magnetic layer and the second outer conductive layer.

According to still another aspect of the present invention, a packaged semiconductor device includes a stack of semiconductor dies that includes at least one magnetic random access memory (MRAM) die, each semiconductor die having first and second planar surfaces and including the plurality of vias that extend between the first and second planar surfaces and are electrically connected to the vias of at least one adjacent semiconductor die, a top semiconductor die of the stack of semiconductor dies including a plurality of die bond pads formed on the first surface of the top semiconductor die; a package substrate having first and second planar surfaces that are substantially larger than the first and second planar surfaces of the stack of semiconductor dies and extending beyond the stack of semiconductor dies on opposing sides, the first planar surface of the package substrate being disposed adjacent to the second planar surface of a bottom semiconductor die of the stack of semiconductor dies and including a plurality of package bond pads formed on the first planar surface of the package substrate not covered by the stack of semiconductor dies, the second planar surface of the package substrate including a plurality of solder bumps that are electrically connected to the package bond pads; a plurality of bonding wires electrically connecting the die bond pads of the top semiconductor die to the package bond pads; and a soft magnetic cap confronting the first planar surface of the top semiconductor die and having an edge that extends toward and attaches to the package substrate, thereby encapsulating the stack of semiconductor dies. The package substrate has a laminated structure that includes first and second outer conductive layers; a soft magnetic layer disposed between the first and second outer conductive layers; a first insulating layer disposed between the soft magnetic layer and the first outer conductive layer; and a second insulating layer disposed between the soft magnetic layer and the second outer conductive layer.

According to yet another aspect of the present invention, a packaged semiconductor device a magnetic random access memory (MRAM) die having first and second planar surfaces, the second planar surface of the MRAM die including a plurality of die bond pads formed thereon; a package substrate having first and second planar surfaces, the first planar surface of the package substrate including a plurality of package bond pads that are electrically connected to the die bond pads by a first plurality of interconnect structures, the second surface of the package substrate including a plurality of solder bumps that are electrically connected to the package bond pads; and a soft magnetic cap confronting the first planar surface of the MRAM die and having an edge that extends toward and attaches to the package substrate, thereby encapsulating the MRAM die. The package substrate has a laminated structure that includes first and second outer conductive layers; a soft magnetic layer disposed between the first and second outer conductive layers; a first insulating layer disposed between the soft magnetic layer and the first outer conductive layer; and a second insulating layer disposed between the soft magnetic layer and the second outer conductive layer.

According to still yet another aspect of the present invention, a packaged semiconductor device a stack of semiconductor dies including at least one magnetic random access memory (MRAM) die, each semiconductor die having first and second planar surfaces and including a plurality of vias that extend between the first and second planar surfaces and are electrically connected to the vias of at least one adjacent semiconductor die; a package substrate having first and second planar surfaces, the first planar surface of the package substrate including a plurality of package bond pads that are electrically connected to a bottom semiconductor die of the stack of semiconductor dies through a plurality of interconnect structures, the second surface of the package substrate including a plurality of solder bumps that are electrically connected to the package bond pads; and a soft magnetic cap confronting the first planar surface of a top semiconductor die of the stack of semiconductor dies and having an edge that extends toward and attaches to the package substrate, thereby encapsulating the stack of semiconductor dies. The package substrate has a laminated structure that includes first and second outer conductive layers; a soft magnetic layer disposed between the first and second outer conductive layers; a first insulating layer disposed between the soft magnetic layer and the first outer conductive layer; and a second insulating layer disposed between the soft magnetic layer and the second outer conductive layer.

BRIEF DESCRIPTION OF DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION OF THE INVENTION

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention, except where the context excludes that possibility.

Where reference is made herein to a material AB composed of element A and element B, the material AB can be an alloy, a compound, or a combination thereof, except where the context excludes that possibility.

Figure 7:
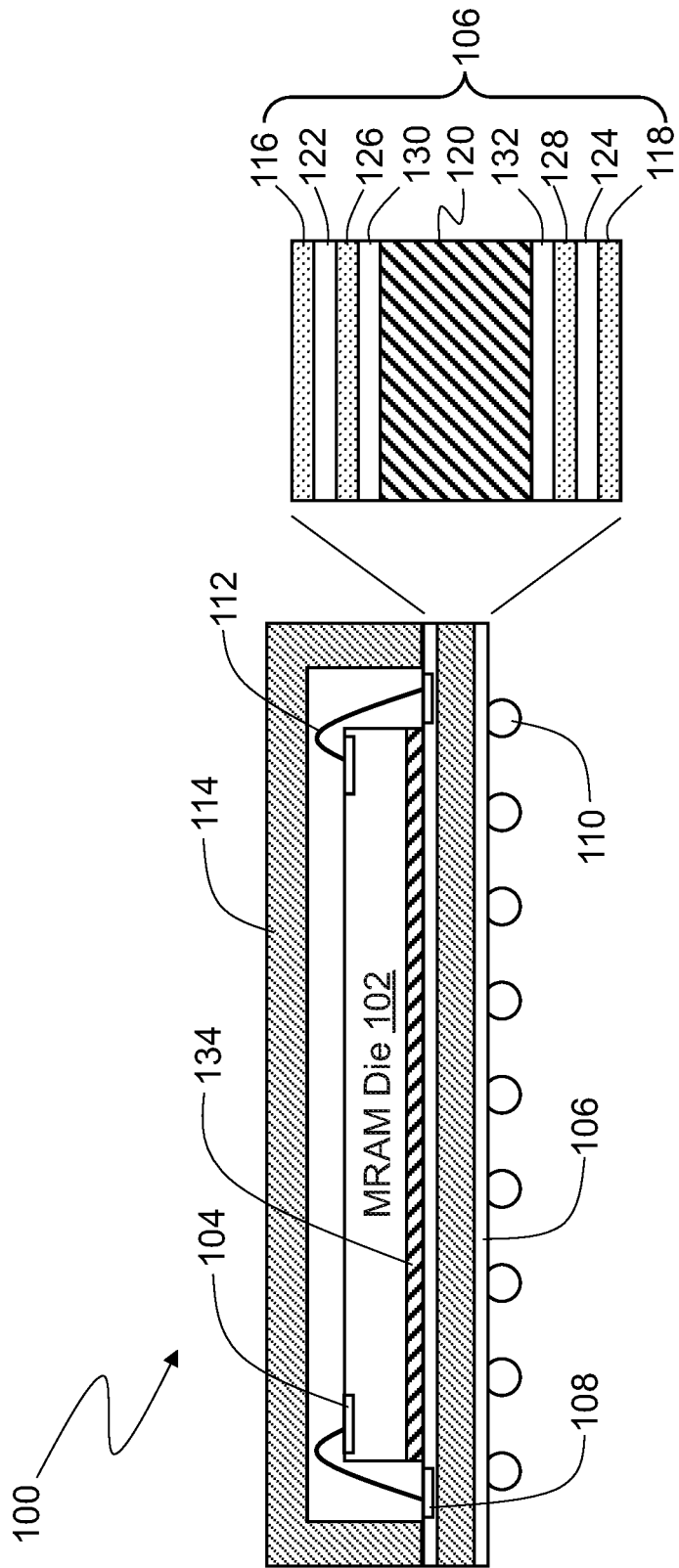
FIG. 7 is a cross-sectional view of a packaged MRAM device in accordance with an embodiment of the present invention.

FIG. 7 is a cross-sectional view of a packaged semiconductor memory device in accordance with an embodiment of the present invention. The packaged semiconductor memory device 100 includes a magnetic random access memory (MRAM) die 102 having first and second planar surfaces with the first planar surface of the MRAM die 102 including a plurality of die bond pads 104 formed thereon; a package substrate 106 having first and second planar surfaces that are substantially larger than the first and second planar surfaces of the MRAM die 102 and extending beyond the MRAM die 102 on opposing sides, the first planar surface of the package substrate 106 being disposed adjacent to the second planar surface of the MRAM die 102 and including a plurality of package bond pads 108 formed on a portion of the first planar surface of the package substrate 106 not covered by the MRAM die 102, the second planar surface of the package substrate 106 including a plurality of solder bumps 110 that are electrically connected to the package bond pads 108; a plurality of bonding wires 112 electrically connecting the die bond pads 104 to the package bond pads 108; and a soft magnetic cap 114 confronting the first planar surface of the MRAM die 102 and having an edge that extends toward and attaches to the package substrate 106, thereby encapsulating the MRAM die 102.

The package substrate 106 has a laminated structure that includes first and second outer conductive layers 116 and 118; a soft magnetic layer 120 disposed between the first and second outer conductive layers 116 and 118; a first insulating layer 122 disposed between the soft magnetic layer 120 and the first outer conductive layer 116; and a second insulating layer 124 disposed between the soft magnetic layer 120 and the second outer conductive layer 118. The package substrate 106 may optionally include a first intermediate conductive layer 126 disposed adjacent to the first insulating layer 122 opposite the first outer conductive layer 116; a second intermediate conductive layer 128 disposed adjacent to the second insulating layer 124 opposite the second outer conductive layer 118; a third insulating layer 130 disposed between the first intermediate conductive layer 126 and the soft magnetic layer 120; and a fourth insulating layer 132 disposed between the second intermediate conductive layer 128 and the soft magnetic layer 120.

The package bond pads 108 and a plurality of electrodes or wires connected thereto (not shown) formed on the first planar surface of the package substrate 106 may be fabricated or patterned from the first outer conductive layer 116. Similarly, the solder bumps 110 on the second planar surface of the package substrate 106 may be formed on pads fabricated or patterned from the second outer conductive layer 118. The first and second outer conductive layers 116 and 118 may be electrically connected through a plurality of vias.

FIGS. 8A-8D illustrate various steps of an exemplary process for fabricating the package substrate 106 with the vias embedded therein. The process begins by providing a soft magnetic layer 120 that may have a relatively high magnetic permeability and comprise any one of iron (Fe), cobalt (Co), nickel (Ni), or any combination thereof. For example and without limitation, the soft magnetic layer 120 may be made of a low carbon steel. The soft magnetic layer 120 may have a thickness that is comparable to or thicker than the MRAM die 102 to enhance the magnetic shielding effect. The soft magnetic layer 120 may also be sufficiently thick to provide mechanical rigidity to the package substrate 106 and the packaged device 100.

Figure 8A:
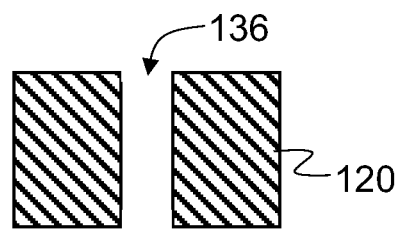
FIGS. 8A-8D are cross-sectional views illustrating formation of package substrate in accordance with an embodiment of the present invention.
Figure 8B:
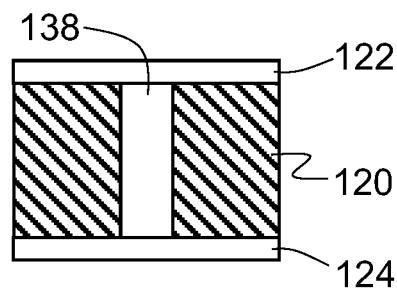
Figure 8C:
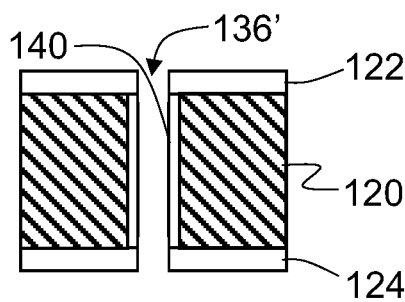
Figure 8D:
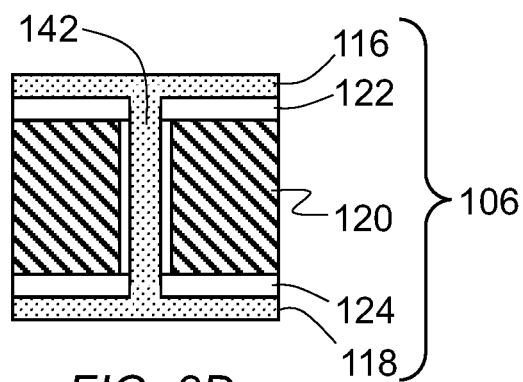

Referring now to FIG. 8A, multiple initial via openings or holes 136 are first created in the soft magnetic layer 120 by any suitable method, such as mechanical drilling or laser drilling. The initial via holes 136 are then filled with an electrically insulating polymeric material 138, such as epoxy, after which the first and second insulating layers 122 and 124 are bonded to the soft magnetic layer 120, as shown in FIG. 8B. The first and second insulating layers 122 and 124 may each comprise an electrically insulating polymeric material, such as epoxy, or an electrically insulating composite material that may provide higher mechanical rigidity, such as fiberglass impregnated with resin. After bonding of the first and second insulating layers 122 and 124 to the soft magnetic layer 120, multiple final via holes 136' are bored through the first insulating layer 122, the electrically insulating polymeric material 138 in the initial via holes 136, and the second insulating layer 124, such that the circumferential portion of the electrically insulating polymeric material 138 is left intact to form an electrically insulating sleeve 140 on the wall of each of the final via holes 136', as shown in FIG. 8C. After the formation of the final via holes 136', the first and second outer conductive layers 116 and 118 and multiple vias 142 that electrically connect the two layers 116 and 118 may be formed by any suitable method, such as but not limited to copper (Cu) plating. The electrically insulating sleeves 140 prevent electrical conduction between the vias 142 and the soft magnetic layer 120.

For embodiments where the package substrate 106 further includes the first and second intermediate conductive layer 126, 128 and the third and fourth insulating layers 130, 132, the fabrication process may begin by laminating the layers 120 and 126-132 first and then create initial via holes through the laminated structure and follow the subsequent steps as described above.

Figure 1:
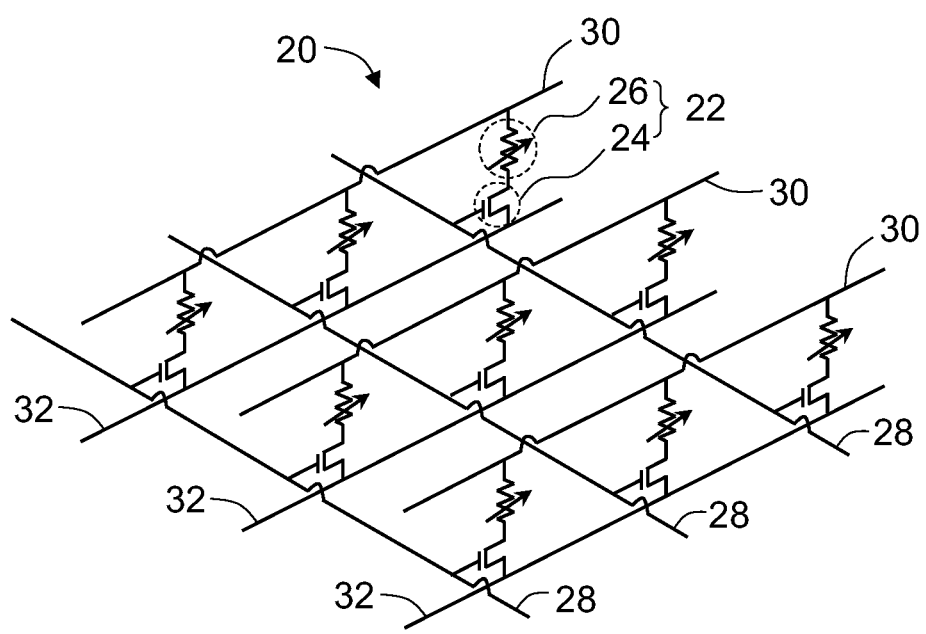
FIG. 1 is a schematic circuit diagram for an array of magnetic memory cells with each magnetic memory cell including a magnetic memory element and an access transistor coupled in series.
Figure 2:
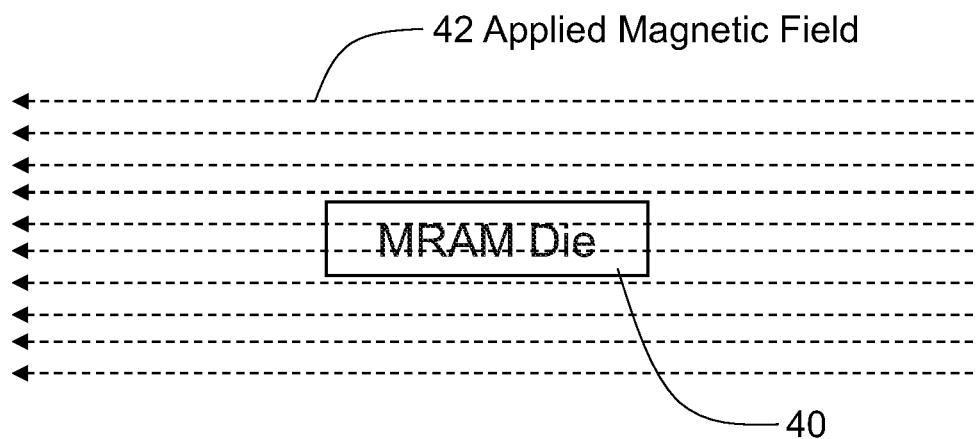
FIG. 2 illustrates exposure of an MRAM die without shielding to an external magnetic field.
Figure 3:
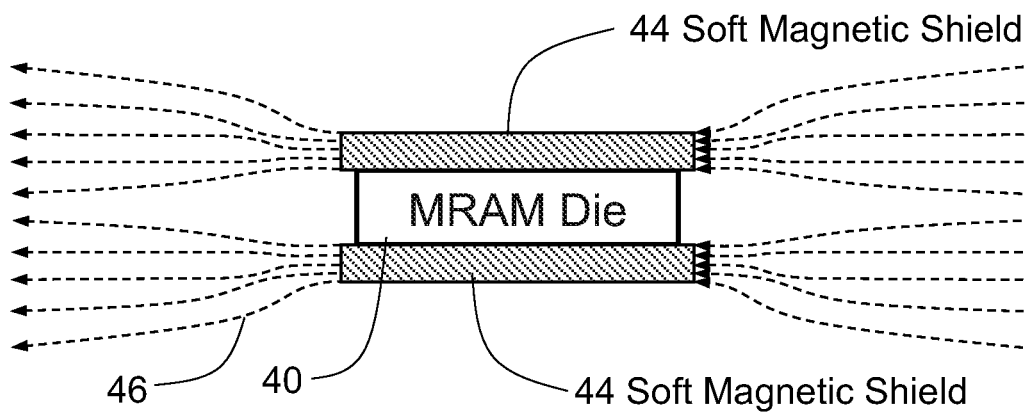
FIG. 3 illustrates shielding of an MRAM die with two conventional magnetic shields attached to opposite planar surfaces of the die when the magnetic field direction is substantially parallel to the planar surfaces.
Figure 4:
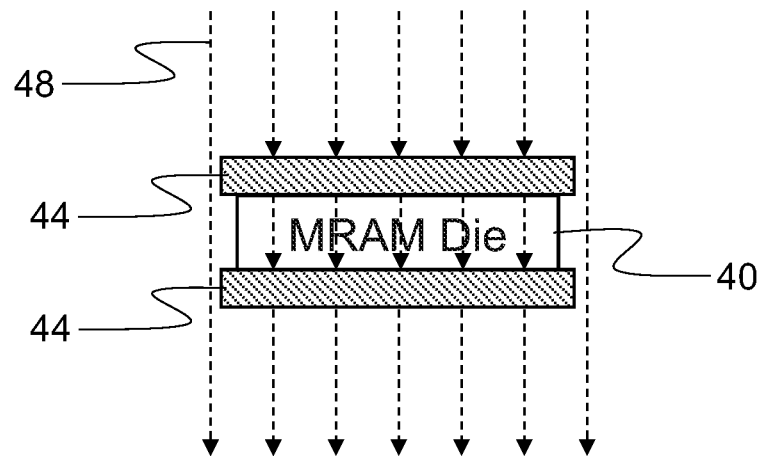
FIG. 4 illustrates lack of shielding of an MRAM die with two conventional magnetic shields attached to opposite planar surfaces of the die when the magnetic field direction is substantially perpendicular to the planar surfaces.
Figure 5:
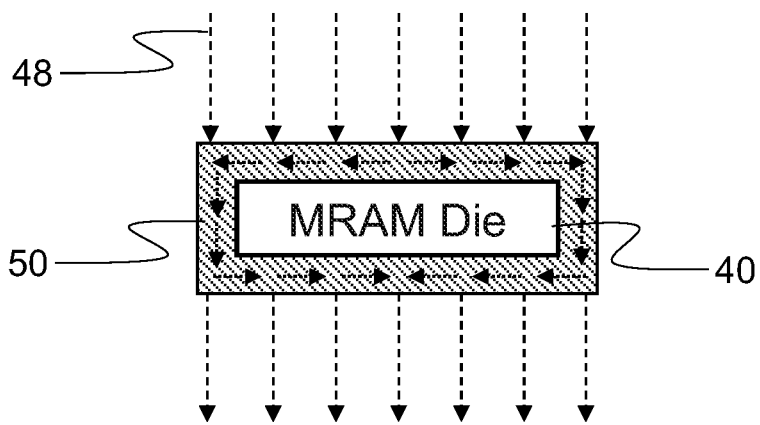
FIG. 5 illustrates the concept of wrap-around shielding to magnetically shield an MRAM die from an external magnetic field having a direction that is substantially perpendicular to the planar surfaces of the die.
Figure 6:
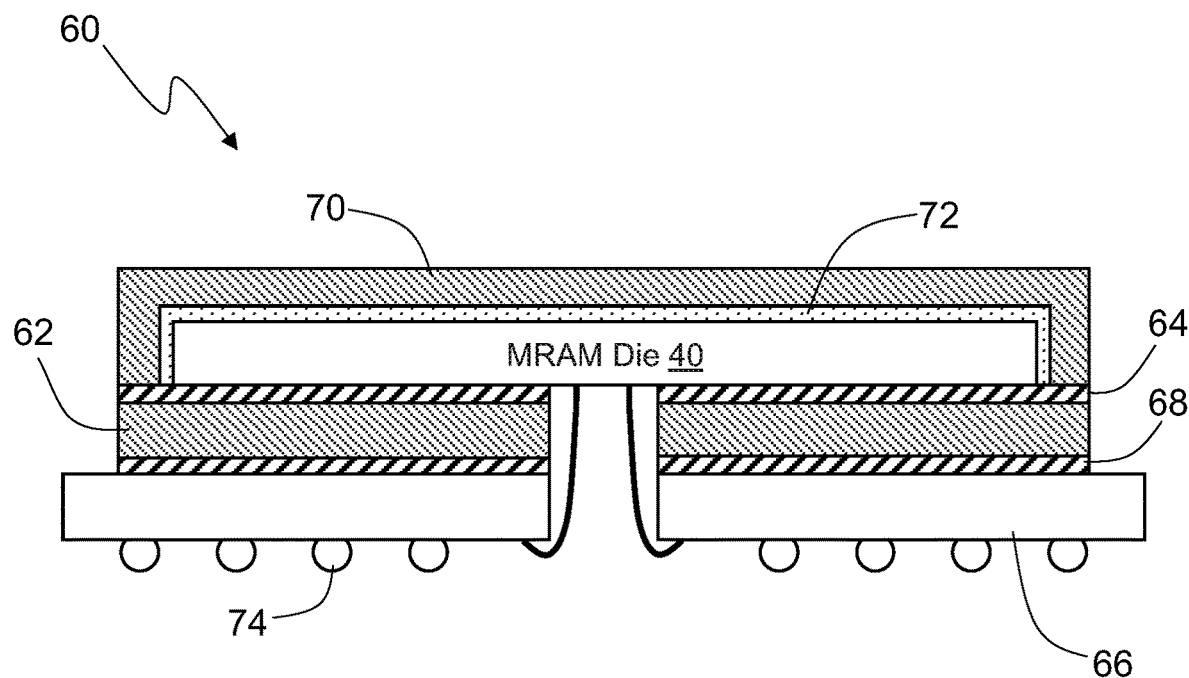
FIG. 6 is a cross-sectional view of a prior art implementation of wrap-around shield for MRAM dies.

Referring back to FIG. 7, the MRAM die 102 may include multiple magnetic memory arrays with each comprising a plurality of magnetic memory cells, such as but not limited to those shown in FIG. 1. Each magnetic memory cell includes a magnetic memory element that may comprise a magnetic reference layer and a magnetic free layer with an electron tunnel junction layer interposed therebetween, which collectively form a magnetic tunnel junction (MTJ). In an embodiment, the magnetic free and reference layers have magnetization directions that are substantially perpendicular to layer planes thereof or the first and second planar surfaces of the MRAM die 102. The MRAM die 102 may be attached to the package substrate 106 using an electrically insulating adhesive material 134, such as but not limited to epoxy.

With continued reference to FIG. 7, the soft magnetic cap 114 may be in a form of rigid shell made of a material that has a relatively high magnetic permeability and comprises any one of iron (Fe), cobalt (Co), nickel (Ni), or any combination thereof. For example and without limitation, the soft magnetic cap 114 may be made of a low carbon steel. Alternatively, the soft magnetic cap 114 may be made of a composite material that includes a nonmagnetic matrix (e.g., resin or epoxy) and ferromagnetic (e.g., iron) or ferrimagnetic (e.g., iron oxide) or superparamagnetic particles dispersed in the nonmagnetic matrix for ease of formability. The soft magnetic cap 114 may be attached to the package substrate 106 by any suitable adhesive, such as but not limited to epoxy. The enclosure formed by the soft magnetic cap 114 and the package substrate 106 provides wrap-around shielding to the MRAM die 102.

Figure 9:
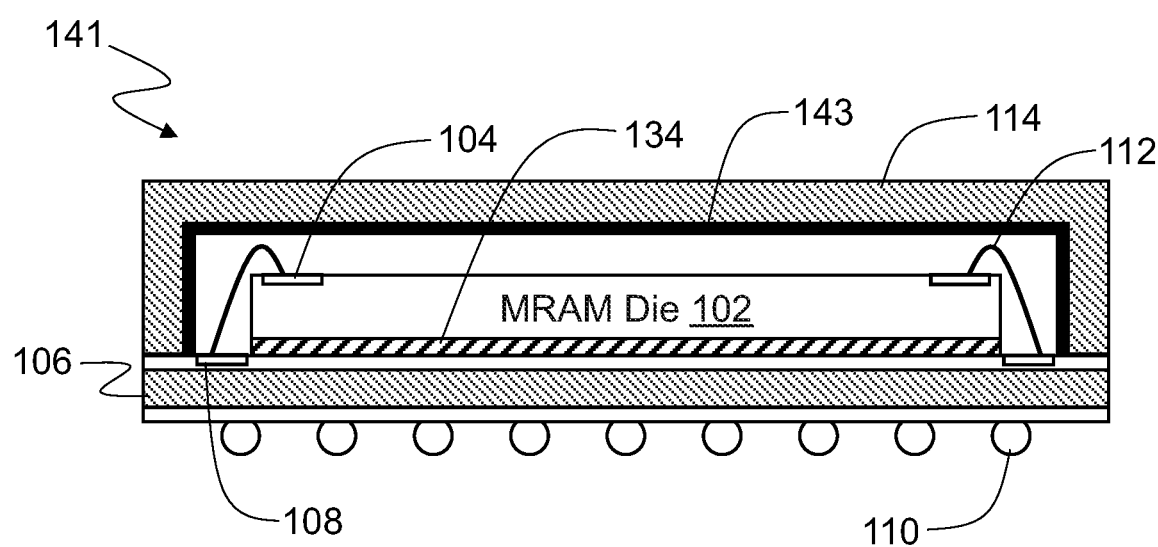
FIG. 9 is a cross-sectional view of a packaged MRAM device in accordance with another embodiment of the present invention.

FIG. 9 is a cross-sectional view of a packaged semiconductor memory device in accordance with another embodiment of the present invention. The packaged semiconductor memory device 141 differs from the packaged semiconductor memory device 100 in that a nonmagnetic shell liner 143 is disposed at the inner surface of the soft magnetic cap 114, between the soft magnetic cap 114 and the MRAM die 102. The nonmagnetic shell liner 143 may cover the assembly of the package substrate 106 and the MRAM die 102 prior to the soft magnetic cap 114 during manufacturing.

Figure 10:
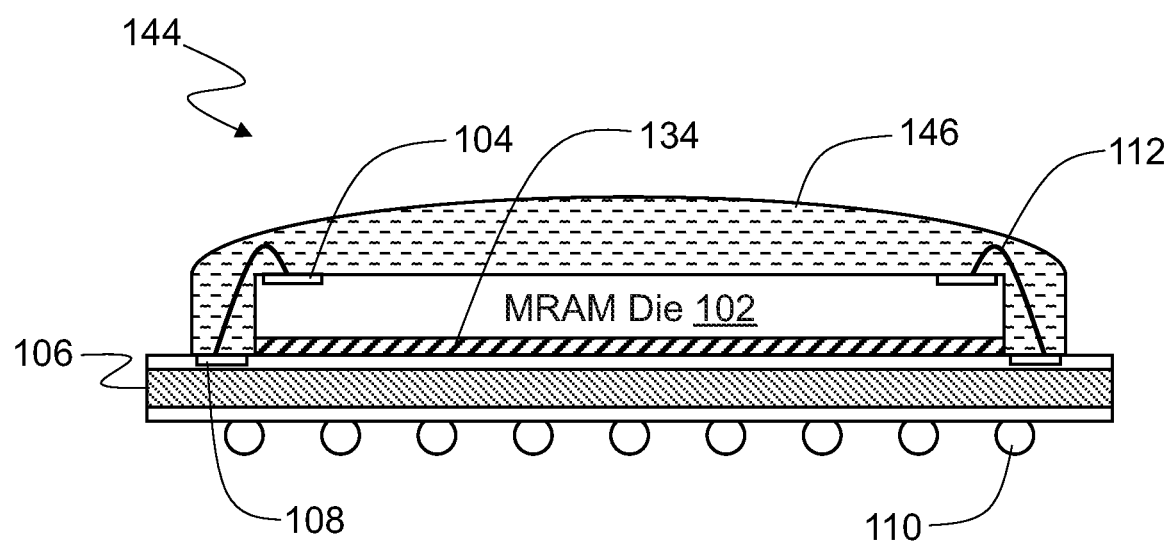
FIG. 10 is a cross-sectional view of a packaged MRAM device that has a soft magnetic cap made of a material that can be liquid or moldable prior to hardening.

While the soft magnetic cap 114 shown in FIGS. 7 and 9 may have a pre-defined or rigid shell shape in the form of a rectangular prism, other shapes or types of soft magnetic structures may be utilized for the present invention. For example and without limitation, FIG. 10 shows another packaged semiconductor memory device 144 that is analogous to the packaged semiconductor memory device 100, except the soft magnetic cap 146 is in the form of a liquid or moldable material (e.g., gel, paste) that can permeate the bonding wires 112 and cover the MRAM die 102 prior to hardening. The soft magnetic cap 146 may be an electrical insulator and may comprise a plurality of magnetic particles dispersed in a polymeric matrix that can be hardened. For example and without limitation, the soft magnetic cap 146 may comprise a plurality of iron oxide particles dispersed in a matrix made of epoxy or resin.

The soft magnetic cap 114 of the packaged semiconductor memory device 141 shown in FIG. 9 may also be replaced by a soft magnetic material that is in a liquid or moldable form (e.g., gel, paste) prior to hardening. Since the soft magnetic material does not come into contact with the die bond pads 104, the package bond pads 108, or the bonding wires 112, the soft magnetic material may be an electrical insulator or conductor and may comprise a plurality of magnetic particles dispersed in a polymeric matrix that can be hardened. For example and without limitation, the soft magnetic material may comprise a plurality of iron oxide or iron particles dispersed in a matrix made of epoxy or resin.

Figure 11:
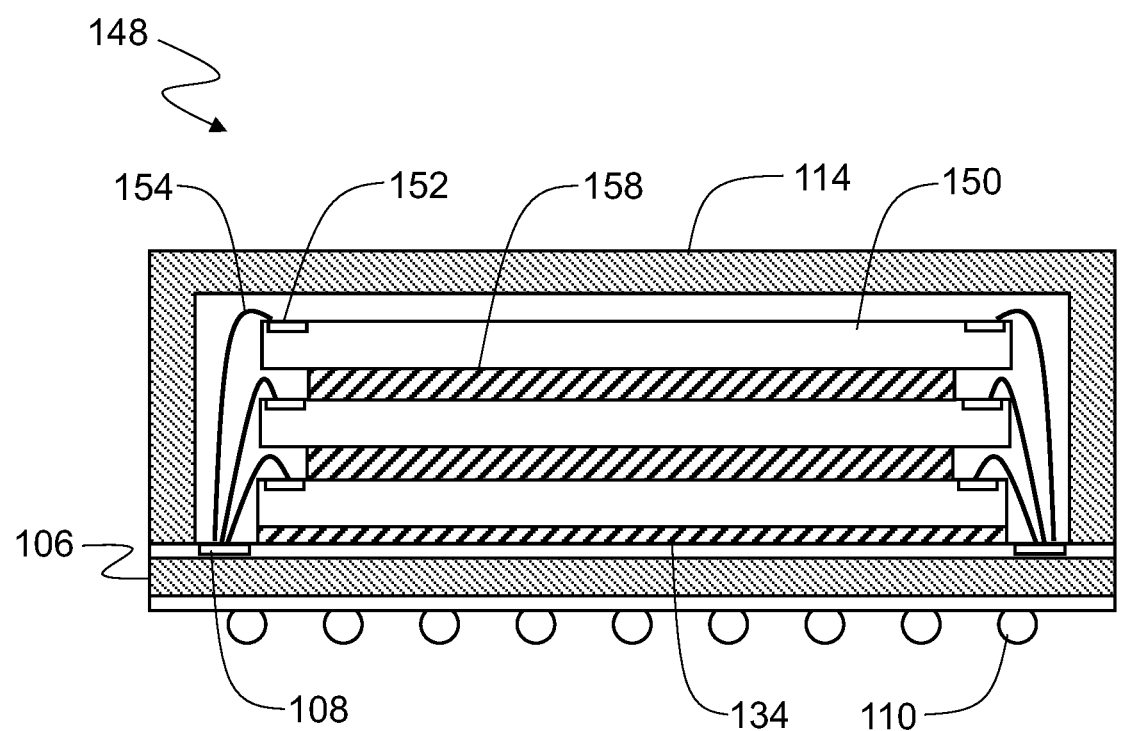
FIG. 11 is a cross-sectional view showing a packaged semiconductor device that includes a stack of semiconductor dies with at least one of the semiconductor dies being an MRAM die.

The present invention may also be used to package a stack of semiconductor dies for three-dimensional (3D) integration. FIG. 11 is a cross-sectional view showing a packaged semiconductor device 148 that includes a stack of semiconductor dies 150 with at least one of the semiconductor dies being an MRAM die. In addition to the MRAM die, the stack of semiconductor dies 150 may include other types of semiconductor dies, such as but not limited to microprocessor die, DRAM memory die, and NAND flash memory die. The packaged semiconductor device 148 includes a stack of semiconductor dies 150, each die of the stack of semiconductor dies 150 having first and second planar surfaces with the first planar surface including a plurality of die bond pads 152 formed thereon; a package substrate 106 having first and second planar surfaces that are substantially larger than the first and second planar surfaces of the stack of semiconductor dies 150 and extending beyond the stack of semiconductor dies 150 on opposing sides, the first planar surface of the package substrate 106 being disposed adjacent to a bottom semiconductor die of the stack of semiconductor dies 150 and including a plurality of package bond pads 108 formed on a portion of the first planar surface of the package substrate 106 not covered by the stack of semiconductor dies 150, the second planar surface of the package substrate 106 including a plurality of solder bumps 110 that are electrically connected to the package bond pads 108; a plurality of bonding wires 154 electrically connecting the die bond pads 152 of each die of the stack of semiconductor dies 150 to the package bond pads 108; and a soft magnetic cap 114 confronting a top semiconductor die of the stack of semiconductor dies 150 and having an edge that extends toward and attaches to the package substrate 106, thereby encapsulating the stack of semiconductor dies 150.

The stack of semiconductor dies 150 has a top semiconductor die whose first planar surface confronts the soft magnetic cap 114 and a bottom semiconductor die whose second planar surface may be bonded to the package substrate 106 by an adhesive material 134, such as but not limited to epoxy. The first and second planar surfaces of two adjacent semiconductor dies of the stack of semiconductor dies 150, respectively, may be bonded to each other by an adhesive material 158, such as but not limited to epoxy. The adhesive material 158 may only coat a part of the first planar surface to allow connection between the bonding wires 154 and the die bond pads 152 disposed around the periphery of the first planar surface.

Each of the one or more MRAM dies in the stack of semiconductor dies 150 may include multiple magnetic memory arrays with each array comprising a plurality of magnetic memory cells, such as but not limited to those shown in FIG. 1. Each magnetic memory cell includes a magnetic memory element that may comprise a magnetic reference layer and a magnetic free layer with an electron tunnel junction layer interposed therebetween, which collectively form a magnetic tunnel junction (MTJ). In an embodiment, the magnetic free and reference layers have magnetization directions that are substantially perpendicular to layer planes thereof or the first and second planar surfaces of the respective MRAM die. In another embodiment, the stack of semiconductor dies 150 comprises entirely of MRAM dies.

Figure 12:
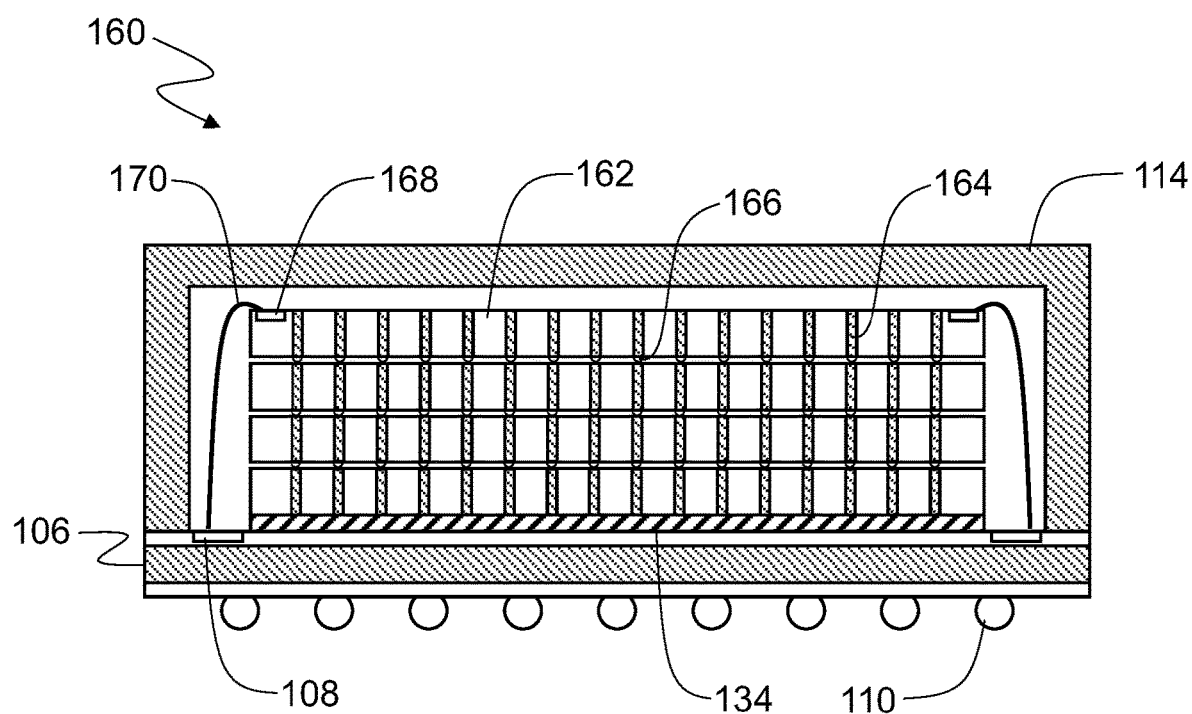
FIG. 12 is a cross-sectional view showing a packaged semiconductor device that includes another stack of semiconductor dies with at least one of the semiconductor dies being an MRAM die.

FIG. 12 is a cross-sectional view showing a packaged semiconductor device 160 that includes another stack of semiconductor dies 162 with at least one of the semiconductor dies being an MRAM die. In addition to the MRAM die, the stack of semiconductor dies 162 may include other types of semiconductor dies, such as but not limited to microprocessor die, DRAM memory die, and NAND flash memory die. Unlike the stack of semiconductor dies 150 where the semiconductor dies are individually connected to the package bond pads 108, each die of the stack of semiconductor dies 162 has a plurality of through-thickness vias 164 that are electrically connected to the vias 164 of the adjacent semiconductor die(s), thereby allowing the stack of semiconductor dies 162 to be electrically connected and integrated like a single IC device. The through-thickness vias 164, also known as through-silicon vias (TSVs) in the parlance of semiconductor art, of each semiconductor die may be electrically connected to the vias 164 of the adjacent semiconductor die(s) in the stack of semiconductor dies 162 by a plurality of interconnect structures 166, such as but not limited to solder bumps and copper micro-bumps, or other analogous conductor structures. The use of the through-thickness vias 164, also enables the heterogenous 3D integration of various microprocessor and memory dies to form an integrated system analogous to system-on-chip (SoC).

With continued reference to FIG. 12, the packaged semiconductor device 160 includes the stack of semiconductor dies 162 including at least one magnetic random access memory (MRAM) die, each semiconductor die having first and second planar surfaces and including the plurality of vias 164 that extend between the first and second planar surfaces and are electrically connected to the vias of at least one adjacent semiconductor die, a top semiconductor die of the stack of semiconductor dies 162 including a plurality of die bond pads 168 formed on the first surface of the top semiconductor die; a package substrate 106 having first and second planar surfaces that are substantially larger than the first and second planar surfaces of the stack of semiconductor dies 162 and extending beyond the stack of semiconductor dies on opposing sides, the first planar surface of the package substrate 106 being disposed adjacent to the second planar surface of a bottom semiconductor die of the stack of semiconductor dies 162 and including a plurality of package bond pads 108 formed on the first planar surface of the package substrate 106 not covered by the stack of semiconductor dies 162, the second planar surface of the package substrate 106 including a plurality of solder bumps 110 that are electrically connected to the package bond pads 108; a plurality of bonding wires 170 electrically connecting the die bond pads 168 of the top semiconductor die to the package bond pads 108; and a soft magnetic cap 114 confronting the first planar surface of the top semiconductor die and having an edge that extends toward and attaches to the package substrate 106, thereby encapsulating the stack of semiconductor dies 162.

The stack of semiconductor dies 162 has the top semiconductor die whose first planar surface confronts the soft magnetic cap 114 and the bottom semiconductor die whose second planar surface may be bonded to the package substrate 106 by an adhesive material 134, such as but not limited to epoxy.

Each of the one or more MRAM dies in the stack of semiconductor dies 162 may include multiple magnetic memory arrays with each array comprising a plurality of magnetic memory cells, such as but not limited to those shown in FIG. 1. Each magnetic memory cell includes a magnetic memory element that may comprise a magnetic reference layer and a magnetic free layer with an electron tunnel junction layer interposed therebetween, which collectively form a magnetic tunnel junction (MTJ). In an embodiment, the magnetic free and reference layers have magnetization directions that are substantially perpendicular to layer planes thereof or the first and second planar surfaces of the respective MRAM die. In another embodiment, the stack of semiconductor dies 162 comprises entirely of MRAM dies.

Figure 13:
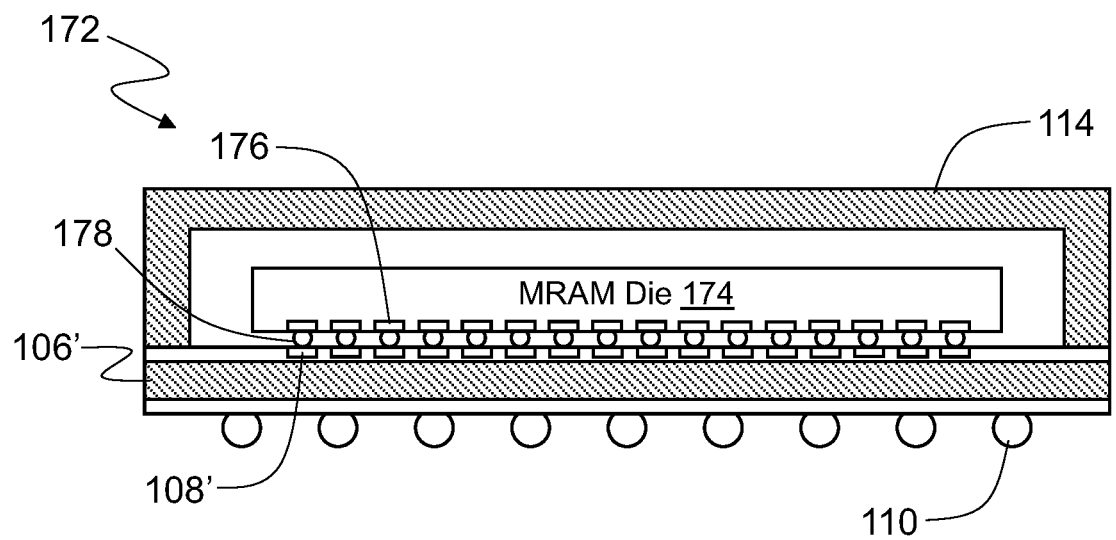
FIG. 13 is a cross-sectional view of a packaged MRAM memory device, illustrating the application of the present invention to flip-chip packaging.

FIG. 13 is a cross-sectional view of a packaged MRAM memory device 172, illustrating the application of the present invention to flip-chip packaging. Unlike the traditional packaging process that uses bonding wires to connect the semiconductor die to the package substrate, the flip-chip packaging process uses interconnect structures, such as solder bumps, to electrically and mechanically couple the semiconductor die to the package substrate. The packaged semiconductor memory device 172 includes a magnetic random access memory (MRAM) die 174 having first and second planar surfaces, the second planar surface of the MRAM die 174 including a plurality of die bond pads 176 formed thereon; a package substrate 106' having first and second planar surfaces, the first planar surface of the package substrate 106' including a plurality of package bond pads 108' that are electrically connected to the die bond pads 176 by a plurality of interconnect structures 178, the second surface of the package substrate 106' including a plurality of solder bumps 110 that are electrically connected to the package bond pads 108'; and a soft magnetic cap 114 confronting the first planar surface of the MRAM die 174 and having an edge that extends toward and attaches to the package substrate 106', thereby encapsulating the MRAM die 174.

The package substrate 106' is analogous to the package substrate 106 illustrated in FIGS. 7, 8A-8D and described above, except that the package bond pads 108' are located at the interface between the MRAM die 174 and the first planar surface of the package substrate 106'.

The MRAM die 174 may include multiple magnetic memory arrays with each comprising a plurality of magnetic memory cells, such as but not limited to those shown in FIG. 1. Each magnetic memory cell includes a magnetic memory element that may comprise a magnetic reference layer and a magnetic free layer with an electron tunnel junction layer interposed therebetween. In an embodiment, the magnetic free and reference layers have magnetization directions that are substantially perpendicular to layer planes thereof or the first and second planar surfaces of the MRAM die 174. The MRAM die 174 may be attached to the package substrate 106' by the interconnect structures 178, such as solder bumps, without additional adhesive material.

Figure 14:
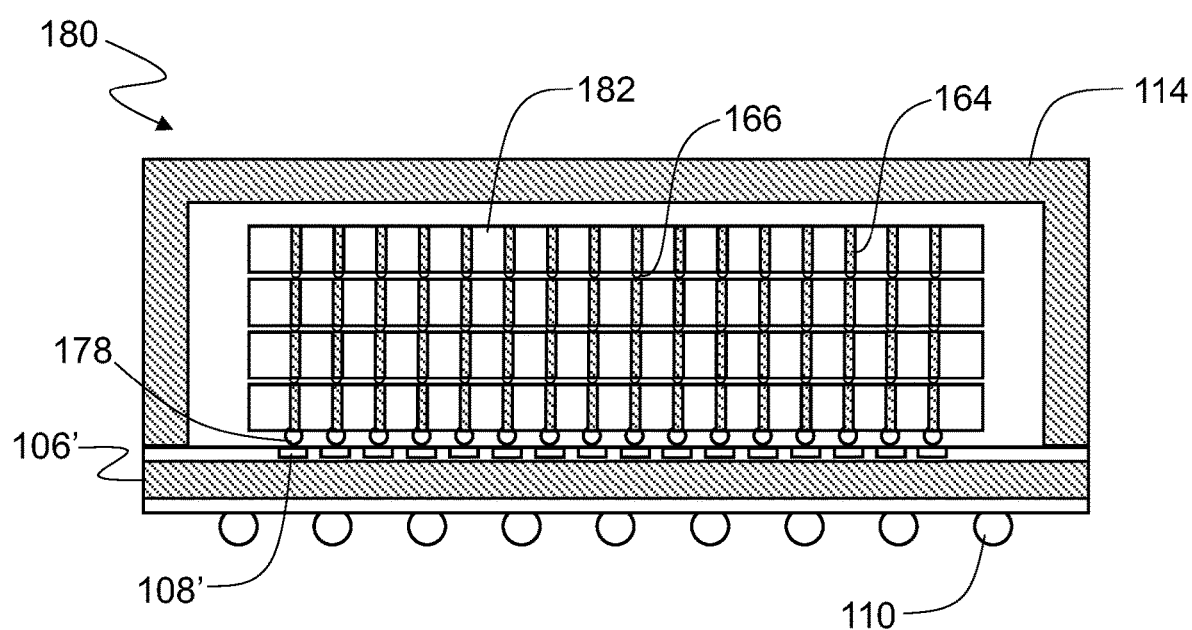
FIG. 14 is a cross-sectional view of a packaged semiconductor device that includes a stack of semiconductor dies with at least one of the semiconductor dies being an MRAM die, illustrating application of the present invention to flip-chip packaging of 3D integrated semiconductor dies.

FIG. 14 is a cross-sectional view of a packaged semiconductor device 180 that includes a stack of semiconductor dies 182 with at least one of the semiconductor dies being an MRAM die, illustrating application of the present invention to flip-chip packaging of 3D integrated semiconductor dies. In addition to the MRAM die, the stack of semiconductor dies 182 may include other types of semiconductor dies, such as but not limited to microprocessor die, DRAM memory die, and NAND flash memory die. Each die of the stack of semiconductor dies 182 has a plurality of through-thickness vias 164 that are electrically connected to the vias 164 of the adjacent semiconductor die(s), thereby allowing the stack of semiconductor dies 182 to be electrically connected and integrated like a single IC device. The through-thickness vias 164 of each semiconductor die may be electrically connected to the vias 164 of the adjacent semiconductor die(s) in the stack of semiconductor dies 162 by a plurality of interconnect structures 166, such as but not limited to solder bumps and copper micro-bumps, or other analogous conductor structures. The use of the through-thickness vias 164, also enables the heterogenous 3D integration of various microprocessor and memory dies to form an integrated system analogous to system-on-chip (SoC).

The packaged semiconductor device 180 includes a stack of semiconductor dies 182 including at least one magnetic random access memory (MRAM) die, each semiconductor die having first and second planar surfaces and including a plurality of vias 164 that extend between the first and second planar surfaces and are electrically connected to the vias 164 of at least one adjacent semiconductor die; a package substrate 106' having first and second planar surfaces, the first planar surface of the package substrate 106' including a plurality of package bond pads 108' that are electrically connected to a bottom semiconductor die of the stack of semiconductor dies 182 through a plurality of interconnect structures 178 (e.g., solder bumps), the second surface of the package substrate 106' including a plurality of solder bumps 110 that are electrically connected to the package bond pads 108'; and a soft magnetic cap 114 confronting the first planar surface of a top semiconductor die of the stack of semiconductor dies 182 and having an edge that extends toward and attaches to the package substrate 106', thereby encapsulating the stack of semiconductor dies 182.

Unlike the stack of semiconductor dies 162 that use the bonding wires 170 for electrical connection to the package substrate 106, the stack of semiconductor dies 182 are electrically connected to the package substrate 106' through the interconnect structures 178, such as but not limited to solder bumps. The second surface of the bottom semiconductor die of the stack of semiconductor dies 182 may include a plurality of die bond pads (not shown) that are electrically connected to the vias 164 of the bottom semiconductor die and the interconnect structures 178.

Each of the one or more MRAM dies in the stack of semiconductor dies 182 may include multiple magnetic memory arrays with each array comprising a plurality of magnetic memory cells, such as but not limited to those shown in FIG. 1. Each magnetic memory cell includes a magnetic memory element that may comprise a magnetic reference layer and a magnetic free layer with an electron tunnel junction layer interposed therebetween, which collectively form a magnetic tunnel junction (MTJ). In an embodiment, the magnetic free and reference layers have magnetization directions that are substantially perpendicular to layer planes thereof or the first and second planar surfaces of the respective MRAM die. In another embodiment, the stack of semiconductor dies 162 comprises entirely of MRAM dies.

Unlike the prior art packaged MRAM devices that have a discrete magnetic shield inserted between the MRAM die and the package substrate, which is incompatible with the flip-chip packaging process, the present invention ingeniously uses the package substrate 106, 106' that incorporates the magnetic shield in the form of the soft magnetic layer 120, thereby allowing an MRAM die or a stack of semiconductor dies containing at least one MRAM die to be packaged using a conventional packaging process, regardless of wire bonding or flip-chip bonding.

It is worth noting that the packaged semiconductor devices 148, 160, 172, 180 of the embodiments shown in FIGS. 11-14 may also optionally include a nonmagnetic shell liner 143 as shown in FIG. 9 or that their soft magnetic cap 114 may be in a liquid or moldable form prior to hardening and may comprise a polymer matrix and a plurality of magnetic particles embedded therein as shown in FIG. 10.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

The invention claimed is:

1. A packaged semiconductor device comprising:
a magnetic random access memory (MRAM) die having first and second planar surfaces, the first planar surface of the MRAM die including a plurality of die bond pads formed thereon;
a package substrate having first and second planar surfaces that are substantially larger than the first and second planar surfaces of the MRAM die and extending beyond the MRAM die on opposing sides, the first planar surface of the package substrate being disposed adjacent to the second planar surface of the MRAM die and including a plurality of package bond pads formed on the first planar surface of the package substrate, the second planar surface of the package substrate including a plurality of solder bumps that are electrically connected to the package bond pads;
a plurality of bonding wires electrically connecting the die bond pads to the package bond pads; and
a soft magnetic cap confronting the first planar surface of the MRAM die and having an edge that extends toward and attaches to the package substrate, thereby encapsulating the MRAM die between the soft magnetic cap and the package substrate,
wherein the package substrate includes:
first and second outer conductive layers;
a soft magnetic layer disposed between the first and second outer conductive layers;
a first insulating layer disposed between the soft magnetic layer and the first outer conductive layer; and
a second insulating layer disposed between the soft magnetic layer and the second outer conductive layer.

2. The packaged semiconductor device of claim 1, wherein the package substrate further includes:
a first intermediate conductive layer disposed adjacent to the first insulating layer;
a second intermediate conductive layer disposed adjacent to the second insulating layer;
a third insulating layer disposed between the first intermediate conductive layer and the soft magnetic layer; and
a fourth insulating layer disposed between the second intermediate conductive layer and the soft magnetic layer.

3. The packaged semiconductor device of claim 1, wherein the first outer conductive layer is etched to form the package bond pads.

4. The packaged semiconductor device of claim 1, wherein the second planar surface of the MRAM die is bonded to the first planar surface of the package substrate.

5. The packaged semiconductor device of claim 1, wherein the soft magnetic cap is bonded to the package substrate.

6. The packaged semiconductor device of claim 1, wherein the soft magnetic cap is in a form of rigid shell comprising iron.

7. The packaged semiconductor device of claim 1, wherein the soft magnetic cap is in a moldable form prior to hardening and comprises a polymer matrix and a plurality of magnetic particles dispersed in the polymer matrix.

8. A packaged semiconductor device comprising:
a stack of semiconductor dies including at least one magnetic random access memory (MRAM) die, each semiconductor die having first and second planar surfaces with each first planar surface including a plurality of die bond pads formed thereon;
a package substrate having first and second planar surfaces that are substantially larger than the first and second planar surfaces of the stack of semiconductor dies and extending beyond the stack of semiconductor dies on opposing sides, the first planar surface of the package substrate being disposed adjacent to the stack of the semiconductor dies and including a plurality of package bond pads formed on the first planar surface of the package substrate, the second planar surface of the package substrate including a plurality of solder bumps that are electrically connected to the package bond pads;
a plurality of bonding wires electrically connecting the die bond pads of each semiconductor die to the package bond pads; and
a soft magnetic cap confronting the stack of semiconductor dies and having an edge that extends toward and attaches to the package substrate, thereby encapsulating the stack of semiconductor dies between the soft magnetic cap and the package substrate,
wherein the package substrate includes:
first and second outer conductive layers;
a soft magnetic layer disposed between the first and second outer conductive layers;
a first insulating layer disposed between the soft magnetic layer and the first outer conductive layer; and
a second insulating layer disposed between the soft magnetic layer and the second outer conductive layer.

9. The packaged semiconductor device of claim 8, wherein the package substrate further includes:
a first intermediate conductive layer disposed adjacent to the first insulating layer;
a second intermediate conductive layer disposed adjacent to the second insulating layer;

a third insulating layer disposed between the first intermediate conductive layer and the soft magnetic layer; and a fourth insulating layer disposed between the second intermediate conductive layer and the soft magnetic layer.

10. The packaged semiconductor device of claim 8, wherein the first and second planar surfaces of two adjacent semiconductor dies are bonded to each other by an adhesive.

11. A packaged semiconductor device comprising:
a stack of semiconductor dies including at least one magnetic random access memory (MRAM) die, each semiconductor die having first and second planar surfaces and including a plurality of vias that extend between the first and second planar surfaces and are electrically connected to the vias of at least one adjacent semiconductor die, a top semiconductor die of the stack of semiconductor dies including a plurality of die bond pads formed on the first surface of the top semiconductor die;
a package substrate having first and second planar surfaces that are substantially larger than the first and second planar surfaces of the stack of semiconductor dies and extend beyond the stack of semiconductor dies on opposing sides, the first planar surface of the package substrate being disposed adjacent to the second planar surface of a bottom semiconductor die of the stack of semiconductor dies and including a plurality of package bond pads formed on the first planar surface of the package substrate, the second planar surface of the package substrate including a plurality of solder bumps that are electrically connected to the package bond pads;
a plurality of bonding wires electrically connecting the die bond pads of the top semiconductor die to the package bond pads; and
a soft magnetic cap confronting the first planar surface of the top semiconductor die and having an edge that extends toward and attaches to the package substrate, thereby encapsulating the stack of semiconductor dies between the soft magnetic cap and the package substrate,
wherein the package substrate includes:
first and second outer conductive layers;
a soft magnetic layer disposed between the first and second outer conductive layers;
a first insulating layer disposed between the soft magnetic layer and the first outer conductive layer; and
a second insulating layer disposed between the soft magnetic layer and the second outer conductive layer.

12. The packaged semiconductor device of claim 11, wherein the package substrate further includes:
a first intermediate conductive layer disposed adjacent to the first insulating layer;
a second intermediate conductive layer disposed adjacent to the second insulating layer;
a third insulating layer disposed between the first intermediate conductive layer and the soft magnetic layer; and
a fourth insulating layer disposed between the second intermediate conductive layer and the soft magnetic layer.

13. The packaged semiconductor device of claim 11, wherein the vias of adjacent semiconductor dies in the stack of semiconductor dies are connected through a plurality of copper micro-bumps.

14. A packaged semiconductor device comprising:
a magnetic random access memory (MRAM) die having first and second planar surfaces, the second planar surface of the MRAM die including a plurality of die bond pads formed thereon;
a package substrate having first and second planar surfaces, the first planar surface of the package substrate including a plurality of package bond pads that are electrically connected to the die bond pads through a plurality of interconnect structures, the second surface of the package substrate including a plurality of solder bumps that are electrically connected to the package bond pads; and
a soft magnetic cap confronting the first planar surface of the MRAM die and having an edge that extends toward and attaches to the package substrate, thereby encapsulating the MRAM die between the soft magnetic cap and the package substrate,
wherein the package substrate includes:
first and second outer conductive layers;
a soft magnetic layer disposed between the first and second outer conductive layers;
a first insulating layer disposed between the soft magnetic layer and the first outer conductive layer; and
a second insulating layer disposed between the soft magnetic layer and the second conductive layer.

15. The packaged semiconductor device of claim 14, wherein the package substrate further includes:
a first intermediate conductive layer disposed adjacent to the first insulating layer;
a second intermediate conductive layer disposed adjacent to the second insulating layer;
a third insulating layer disposed between the first intermediate conductive layer and the soft magnetic layer; and
a fourth insulating layer disposed between the second intermediate conductive layer and the soft magnetic layer.

16. The packaged semiconductor device of claim 14, wherein the interconnect structures are solder bumps.

17. A packaged semiconductor device comprising:
a stack of semiconductor dies including at least one magnetic random access memory (MRAM) die, each semiconductor die having first and second planar surfaces and including a plurality of vias that extend between the first and second planar surfaces and are electrically connected to the vias of at least one adjacent semiconductor die;
a package substrate having first and second planar surfaces, the first planar surface of the package substrate including a plurality of package bond pads that are electrically connected to a bottom semiconductor die of the stack of semiconductor dies through a plurality of interconnect structures, the second surface of the package substrate including a plurality of solder bumps that are electrically connected to the package bond pads; and
a soft magnetic cap confronting the first planar surface of a top semiconductor die of the stack of semiconductor dies and having an edge that extends toward and attaches to the package substrate, thereby encapsulating the stack of semiconductor dies between the soft magnetic cap and the package substrate,
wherein the package substrate includes:
first and second outer conductive layers;
a soft magnetic layer disposed between the first and second outer conductive layers;

a first insulating layer disposed between the soft magnetic layer and the first outer conductive layer; and a second insulating layer disposed between the soft magnetic layer and the second conductive layer.

18. The packaged semiconductor device of claim 17, wherein the package substrate further includes:

a first intermediate conductive layer disposed adjacent to the first insulating layer;

a second intermediate conductive layer disposed adjacent to the second insulating layer;

a third insulating layer disposed between the first intermediate conductive layer and the soft magnetic layer; and a fourth insulating layer disposed between the second intermediate conductive layer and the soft magnetic layer.

19. The packaged semiconductor device of claim 17, wherein the vias of adjacent semiconductor dies in the stack of semiconductor dies are connected through a plurality of copper micro-bumps.

20. The packaged semiconductor device of claim 17, wherein the bottom semiconductor die of the stack of semiconductor dies includes a plurality of die bond pads formed on the second surface of the bottom semiconductor die.

* * * * *